United States Patent [19]

Legatti et al.

[11] Patent Number: 4,552,018

[45] Date of Patent: Nov. 12, 1985

[54] INTERCHANGEABLE SCALE METER CASE

[75] Inventors: R. H. Legatti, Jr., Belleair, Fla.; H. R. Woolner, Manchester; R. J. Cushing, Jr., South Alexandria, both of N.H.

[73] Assignee: Square D Company, Palatine, Ill.

[21] Appl. No.: 465,847

[22] Filed: Feb. 1, 1983

Related U.S. Application Data

[63] Continuation of Ser. No. 234,212, Feb. 13, 1981, abandoned.

[51] Int. Cl.[4] .......................... G01P 1/08; G01R 1/08
[52] U.S. Cl. ..................................... 73/431; 116/334; 324/115
[58] Field of Search ......................... 73/431; 324/115; 116/334, 221

[56]     References Cited
    U.S. PATENT DOCUMENTS

| | | | |
|---|---|---|---|
| 2,528,640 | 11/1950 | Coleman | 73/431 |
| 2,794,412 | 6/1957 | Rauth | 116/334 |
| 3,138,137 | 6/1964 | Hubner | 324/115 X |
| 3,441,352 | 4/1969 | Hughes | 324/115 X |
| 3,446,178 | 5/1969 | Clair et al. | 324/115 X |
| 3,638,119 | 1/1972 | Mackenzie | 324/115 X |
| 4,445,789 | 5/1984 | Peart et al. | 73/431 X |
| 4,459,848 | 7/1984 | Huret | 73/431 |

Primary Examiner—Daniel M. Yasich
Attorney, Agent, or Firm—Richard T. Guttman; Donald P. Reynolds; James W. Potthast

[57]     ABSTRACT

A case for encasing a meter movement and its associated pointer comprised of an assembly at least a portion of which is transparent which completely encases the meter movement and pointer, connecting means for providing input signals to the meter movement through the assembly, a rear cover having openings for receiving the connecting means and proportioned to abut the rear of the assembly with the connecting means disposed within those openings, a scale of generally flat dimensions for displaying the parameter to be measured by the meter movement and indicated by the pointer which scale is held fixedly between the rear cover and the assembly in a position allowing a sweeping of the pointer across the face of the scale to indicate the level of the parameter sensed by the meter movement thereby allowing an exchange of the scale for some second scale without any possibility of physically engaging the pointer or the meter movement and causing damage thereto.

1 Claim, 2 Drawing Figures

INTERCHANGEABLE SCALE METER CASE

This application is a continuation of application Ser. No. 234,212, filed Feb. 13, 1981, now abandoned.

BACKGROUND OF THE INVENTION

This invention relates to meters which are employed to measure various quantities and indicate, by means of a pointer sweeping across a graduated scale, the level of its particular parameter present at a particular point in time and, more specifically, to the manner in which such meters are encased for protection of the delicate components of those meters and for mounting of those meters in the environment in which they will operate.

Meters are used to measure such diverse parameters as electrical potential, electrical current, fluid pressure, and fluid speed. Often times, the basic meter movement mechanism for measuring different parameters, such as electrical properties or fluid properties, is the same meter movement. Adaptation of that basic meter movement to measure a particular parameter is accomplished by varying the manner in which the meter movement is connected to the environment in which the particular parameter is to be measured. For example, an electrical meter may be associated with a bridge circuit to indicate potential difference or the same basic meter movement may be connected to an amplifier and a detecting device to indicate such parameters as pressure, heat or the like. Additionally, meters may be used as gauges for comparative purposes rather than parameter measurement. Therefore, the only difference between two meters intended to measure two different parameters may often be the difference in the graduated scales across which the pointers of the respective meters will sweep when those meters react to the given environments they are measuring.

The meter movements and pointers of such meters are extremely delicate and prone to being damaged or rendered unacceptably inaccurate by physical contact with them, such as may be experienced in inserting a different scale to accommodate a new application of that meter. By designing a meter which would accommodate interchanging of scales while precluding any possibility of physically contacting the meter movement or the pointer, one could realize significant economies in manufacturing such meter movements and pointers, as well as in inventory stocking levels at wholesale and resale points in a distribution chain. Keepers of inventories of such meters could maintain an inventory of one particular meter movement and pointer while stocking various scales to meet the various needs to measure particular parameters.

SUMMARY OF THE INVENTION

The present invention discloses a meter case which is constructed to facilitate very simple disassembly of the case to allow insertion of alternate scales to meet the demands of varying environments. Upon disassembly of the case to facilitate insertion of a scale, the meter case presents two pieces: an assembly which completely encases the meter movement as well as its associated pointer, and a rear cover which abuts the rear of that assembly and, when the case is reassembled, the structure of the assembly and the pressure of the rear cover against that assembly serve to fixedly locate the scale in an appropriate position to allow accurate indication of the parameter to be measured by the sweeping of the pointer across that scale.

It is, therefore, an object of the present invention to provide a meter case which allows simple interchanging of scales without any possibility of physically engaging and thereby damaging the delicate meter movement or pointer contained within that meter case.

Figure 1:
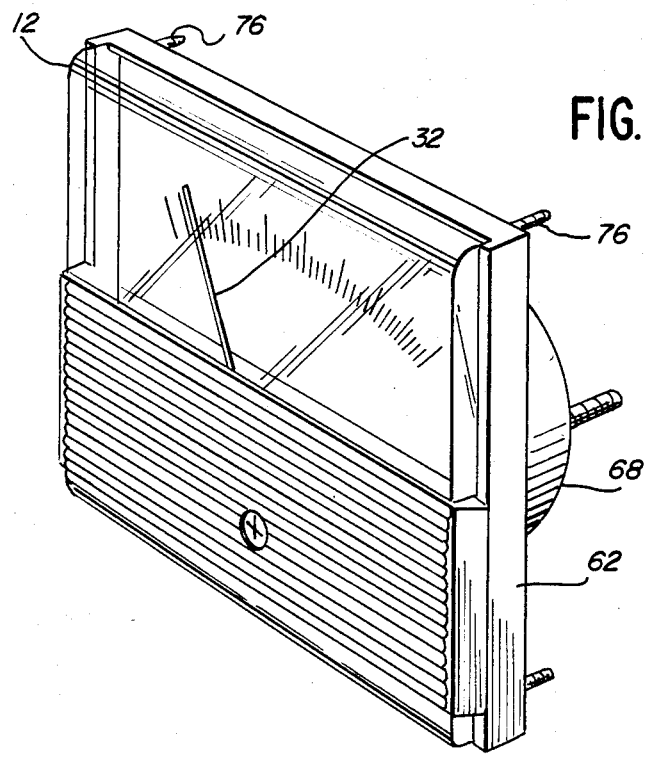
FIG. 1 is a perspective view of the preferred embodiment of the meter case fully assembled.
Figure 2:
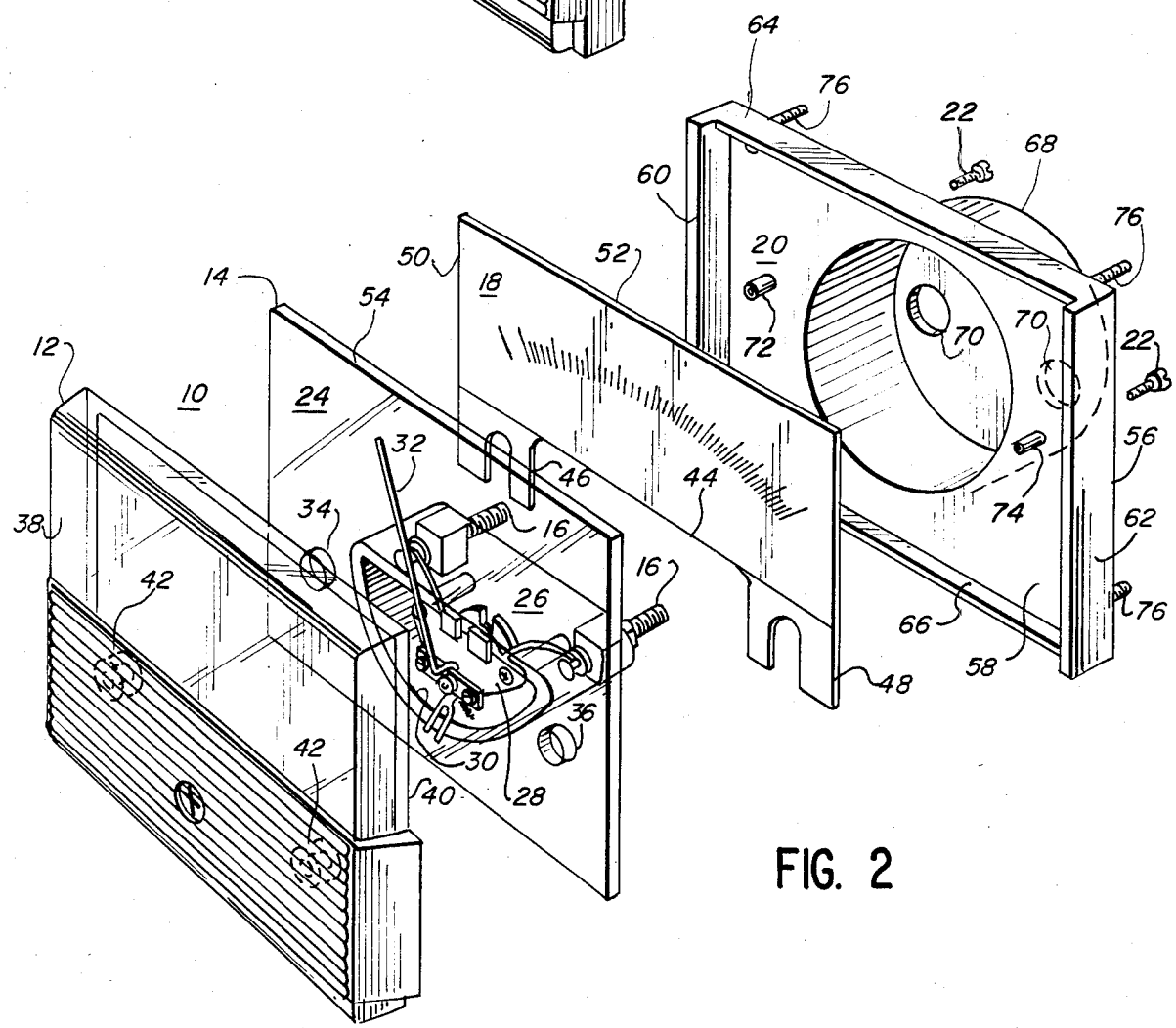
FIG. 2 is an exploded perspective view of the preferred embodiment of the meter case.

In describing the preferred embodiment of the invention illustrated in the drawing, specific terminology will be resorted to for the sake of clarity. However, the invention is not intended to be limited to these specific terms so selected and it is to be understood that each specific term contains all technical equivalents which operate in a similar manner to accomplish a similar purpose. For example, the terms "connected" or "coupled" may include connection through other device elements wherein such connection is recognized as equivalent and operates in essentially the same manner to accomplish the same purpose.

DETAILED DESCRIPTION

The meter case includes an assembly 10 comprised of a face plate 12 and a body 14, connecting means 16, a scale means 18, a rear cover 20, and securing screws 22.

The body 14 is comprised of a plate 24 and perpendicular thereto a protrusion 26. Fixedly carried inside the protrusion 26 is the meter movement 28. A pointer 32 is located parallel to the plate 24 and on the opposite side of the plate 24 than that side upon which the protrusion 26 is attached. The pointer 32 is connected to the meter movement 28 through a hole 30 in the plate 24. The plate 24 also has holes 34 and 36 sized and positioned to receive the screws 22 for securing the meter case when the case is fully assembled. The face plate 12 is a generally rectangular-shaped box enclosed on its front 38 and open on its rear 40. Affixed to the rear side of the front face 38 of the face plate 12 and extending perpendicularly rearward therefrom are two screw posts 42 sized, threaded and positioned to receive the screws 22 when the case is fully assembled. The connecting means 16 are mounted upon the rear of the protrusion 26, penetrate the protrusion 26 and are connected to the meter movement 28 to provide the meter movement 28 appropriate exposure to the environment to which the meter movement 28 is to respond. The ends of the lower edge 44 of the scale means 18 form inverted U-tabs 46 and 48. The horizontal displacement of the inverted U-tabs 46 and 48 is an appropriate distance to allow the scale means 18 to rest astride or seated on the protrusion 26 with the inverted U-tabs 46 and 48 adjacent the protrusion 26 on either side thereof. The vertical dimension 50 of the scale means 18 is appropriate to ensure that, when the scale means 18 rests on its lower edge 44 astride the protrusion 26 with inverted U-tabs 46 and 48 adjacent to protrusion 26 on either side thereof, the upper edge 52 of the scale means 18 is aligned with the top 54 of the plate 24, thereby ensuring that the scale means 18 is properly positioned to accurately indicate the parameter measured by the meter movement 28 as that measurement is manifested by the weeping of the piointer 32 across the scale means 18.

The rear cover 20 is generally rectangular in shape, closed on its rear side 56 and open on its front side 58. The sides 60 and 62 of the rear cover 20 are slightly wider than the top member 64 and the bottom member 66 of the rear cover 20. The rear side 56 of the cover 20 has a turricular receptacle 68 proportioned to receive the protrusion 26 when the meter case is fully assembled. The rear side of the turricular receptacle 68 has holes 70 positioned and dimensioned to allow the connecting means 16 to pass through the holes 70 when the meter case is fully assembled thereby allowing access to the connecting means 16 from outside of the meter case when it is fully assembled. Affixed to the front of the rear side 56 of the rear cover 20 and extending perpendicularly forward therefrom are posts 72 and 74 proportioned to accept the screws 22 and positioned to align with the holes 34 and 36 on the plate 24 and the screw posts 42 on the face plate 12 when the meter case is fully assembled.

Thus, when the meter case is fully assembled, the scale means 18 is astride the protrusion 26 with its lower edge 44 resting upon the protrusion 26 and inverted U-tabs 46 and 48 on either side of and adjacent to the protrusion 26. The rear cover 20 is flush against the assembly 10 and firmly holds the scale means 18 between the rear cover 20 and the assembly 10. The inverted U-tabs 46 and 48 contain within their respective U-sections, the posts 72 and 74, respectively. The screws 22 are driven home into the screw posts 42 passing through the posts 72 and 74, the inverted U-tabs 46 and 48, and the holes 34 and 36. The protrusion 26 is nestled within the turricular receptacle 68 and the connecting means 16 protrude through the holes 70 in the turricular receptacle 68.

Threaded mounting posts 76 are affixed to the rear of the rear cover 20 to facilitate mounting of the meter in its meter case upon a panel.

It is to be understood that, while the detailed drawing and specific examples given describe preferred embodiments of the invention, they are for the purposes of illustration only, that the apparatus of the invention is not limited to the precise details and conditions disclosed and that various changes may be made therein without departing from the spirit of the invention which is defined by the following claims:

I claim:
1. A case for encasing a meter movement and its associated pointer, said case comprising:
   a. an assembly further comprising:
      (1) a faceplate, at least a portion of which is transparent; and
      (2) a body, at least a portion formed as a plate, a portion of said plate being transparent, said body carrying said meter movement on protrusion means and said pointer fixedly therein and fixedly engaging said faceplate to form said assembly whereby said assembly completely encases said meter movement and said pointer;
   b. connecting means for providing input signals to said meter movement, said connecting means being connected to said meter movement and penetrating said assembly;
   c. a rear cover having at least one opening for receiving said connecting means and proportioned to abut the rear of said assembly and securely attached thereto with said connecting means disposed within at least one of said openings;
   d. scale means having at least one depending tab means and being of generally flat dimensions for displaying a parameter to be measured by said meter movement and indicated by said pointer, said scale means arranged to be held fixedly between said rear cover and said assembly in a position seated on said protrusion means for allowing a sweeping of said pointer across the face of said scale means to indicate a level measurement of said parameter sensed by said meter movement, said arrangement thereby allowing an exchange of said scale means for some second scale means without any possibility of physically engaging said pointer or said meter movement and causing damage thereto; and
   e. securing means for fixedly securing said face plate, said body plate portion, said rear cover and said scale means in proper position with respect to each other.

* * * * *